United States Patent
Deshpande et al.

(10) Patent No.: US 10,534,056 B2
(45) Date of Patent: Jan. 14, 2020

(54) SYSTEM FOR SIMULTANEOUS DUAL-SLAB ACQUISITION OF MR IMAGES WITH ASYMMETRIC AND TIME-REVERSED ASYMMETRIC, CONCATENATED PULSES

(71) Applicants: Vibhas S Deshpande, Austin, TX (US); Gerhard Laub, San Mateo, CA (US)

(72) Inventors: Vibhas S Deshpande, Austin, TX (US); Gerhard Laub, San Mateo, CA (US)

(73) Assignee: Siemens Healthcare GmbH, Erlangen (DE)

( * ) Notice: Subject to any disclaimer, the term of this patent is extended or adjusted under 35 U.S.C. 154(b) by 1767 days.

(21) Appl. No.: 13/857,172

(22) Filed: Apr. 5, 2013

(65) Prior Publication Data

US 2014/0002077 A1    Jan. 2, 2014

Related U.S. Application Data

(60) Provisional application No. 61/664,869, filed on Jun. 27, 2012.

(51) Int. Cl.
  *G01R 33/56* (2006.01)
  *G01R 33/36* (2006.01)

(52) U.S. Cl.
  CPC ......... *G01R 33/56* (2013.01); *G01R 33/3628* (2013.01)

(58) Field of Classification Search
  USPC .......................... 324/300–322; 600/407–435
  See application file for complete search history.

(56) References Cited

U.S. PATENT DOCUMENTS

| | | | | |
|---|---|---|---|---|
| 4,837,513 A | * | 6/1989 | Yao | G01R 33/561 |
| | | | | 324/309 |
| 5,150,053 A | * | 9/1992 | Pauly | G01R 33/446 |
| | | | | 324/307 |

(Continued)

FOREIGN PATENT DOCUMENTS

| | | |
|---|---|---|
| CN | 8103425 A | 4/1996 |
| CN | 101676737 A | 3/2010 |
| WO | 2011039692 A2 | 4/2011 |

OTHER PUBLICATIONS

Hargreaves BA, Cunningham CH, Pauly JM, Daniel BL. "Independent phase modulation for efficient dual-band 3D imaging", Magnetic Resonance in Medicine 2007; 57: 798-802.

(Continued)

*Primary Examiner* — Melissa J Koval
*Assistant Examiner* — Tiffany A Fetzner

(57) ABSTRACT

A system uses multiple RF coils in MR imaging and an RF (Radio Frequency) signal generator generates RF excitation pulses in anatomical regions of interest and enables subsequent acquisition of associated RF echo data. A magnetic field gradient generator generates anatomical volume select magnetic field gradients for phase encoding and readout RF data acquisition. The RF signal generator and the gradient generator substantially concurrently acquire first and second volumes of first and second different anatomical regions by providing, a first RF pulse having a first asymmetric shape followed by a successive second RF pulse substantially having the first asymmetric shape but reversed in time, to substantially reduce echo time (TE) differences between acquisition of the first and second volumes and a phase encoding magnetic field gradient prepares for acquisition of data representing the first and second volumes.

15 Claims, 5 Drawing Sheets

(56) References Cited

U.S. PATENT DOCUMENTS

| | | | | |
|---|---|---|---|---|
| 5,391,989 | A * | 2/1995 | Takane | G01R 33/563 324/309 |
| 5,565,776 | A | 10/1996 | Kanazawa | |
| 5,860,921 | A | 1/1999 | Ma et al. | |
| 6,252,399 | B1 * | 6/2001 | Pruessmann | G01R 33/446 324/307 |
| 6,583,623 | B1 * | 6/2003 | Kwok | G01R 33/4828 324/306 |
| 6,850,063 | B2 * | 2/2005 | Hennig | G01R 33/5613 324/307 |
| 7,592,806 | B2 * | 9/2009 | Josan | G01R 33/54 324/305 |
| 7,777,488 | B2 * | 8/2010 | Gore | G01R 33/4824 324/307 |
| 7,990,142 | B2 * | 8/2011 | Ookawa | G01R 33/4828 324/307 |
| 8,237,439 | B2 * | 8/2012 | Lee | G01R 33/4836 324/307 |
| 8,723,517 | B2 * | 5/2014 | Takahashi | G01R 33/4816 324/307 |
| 2006/0232273 | A1 | 10/2006 | Takizawa et al. | |
| 2009/0021254 | A1 * | 1/2009 | Gore | G01R 33/4824 324/309 |
| 2009/0058418 | A1 * | 3/2009 | Josan | G01R 33/54 324/309 |
| 2011/0037465 | A1 * | 2/2011 | Lee | G01R 33/4833 324/307 |
| 2011/0144474 | A1 | 6/2011 | Ouwerkerk | |
| 2011/0245655 | A1 * | 10/2011 | Abe | G01R 33/4816 600/410 |
| 2012/0013336 | A1 * | 1/2012 | Hetzer | G01R 33/4818 324/309 |
| 2012/0019243 | A1 * | 1/2012 | Takahashi | G01R 33/4816 324/309 |
| 2013/0057280 | A1 * | 3/2013 | Feiweier | G01R 33/4835 324/309 |
| 2014/0002077 | A1 * | 1/2014 | Deshpande | G01R 33/56 324/309 |

OTHER PUBLICATIONS

Larkman DJ, Hajnal JV, Herlihy AH, Coutts GA, Young IR, Ehnholm G. "Use of multicoil arrays for separation of signal from multiple slices simultaneously excited", Journal of Magnetic Resonance Imaging 13:313-317 (2001).

Moeller S, Yacoub E, Olman CA, Auerbach E, Strupp J, Harel N, Ugurbil K. "Multiband multislice GE-EPI at 7 Tesla, with 16-fold acceleration using partial parallel imaging with application to high spatial and temporal whole-brain FMRI", Magnetic Resonance in Medicine 63:1144-1153 (2009).

Breuer FA, Blaimer M, Heidemann RM, Mueller MF, Griswold MA, Jakob PM. Controlled aliasing in parallel imaging results in higher acceleration (CAIPIRINHA) for multi-slice imaging. Magnetic Resonance in Medicine 2005; 53(3):684-91.

Office Action dated Jan. 30, 2015 in CN Application No. 201310261877.1 (English translation included).

* cited by examiner

SYSTEM FOR SIMULTANEOUS DUAL-SLAB ACQUISITION OF MR IMAGES WITH ASYMMETRIC AND TIME-REVERSED ASYMMETRIC, CONCATENATED PULSES

CROSS-REFERENCE TO RELATED APPLICATIONS

This application is a non-provisional of, and claims priority to, U.S. provisional patent application Ser. No. 61/664,869 by V. S. Deshpande et al. filed on Jun. 27, 2012.

FIELD OF THE INVENTION

This invention concerns a system for using multiple RF coils in MR imaging of an anatomical volume of breast or other anatomy, by concurrently acquiring first and second volumes of first and second different anatomical regions using an RF pulse sequence to substantially reduce echo time (TE) differences between the first and the second volume which are acquired concurrently.

BACKGROUND OF THE INVENTION

Imaging speed can be doubled as known with minimal loss in signal-to noise-ratio (SNR) by using a multi band acquisition. For a dual-band example, this is achieved by exciting two spatially separated slabs concurrently using a wideband pulse, and concurrently reading out the data. Concurrent readout of the two slabs leads to image aliasing, with one slab overlapping the other. These images are then unaliased in image reconstruction by using receiver coil sensitivities. Many 2D and 3D applications could benefit from such a technique. Peripheral MR angiography or breast imaging may be ideally suited for this application because the anatomy and coils are spatially separated in space, thus (a) time spent in encoding FOV outside of the anatomy of interest may be minimized and (b) by making image reconstruction better due to vastly different coil sensitivities. Another advantage of limiting the excitation may be that the g-factor penalty is also reduced. One limitation of dual (or multi) band pulses is that the individual slabs need to be the same thickness and orientation, but only spatially separated. Alternately, separate RF pulses may be used to excite the two slabs instead of a multiband pulse. One big advantage of using two separate pulses to excite the two bands, as opposed to one multiband pulse, is that the thickness and orientation of the two slabs can be controlled independently. However, when using two separate RF pulses the echo times (TEs) will be different for both slabs, depending on the durations of the two RF pulses. Since TE has a large impact on the soft tissue contrast, this difference in TE can create a significant difference in image contrast between the two slices/slabs, which is undesirable. A system according to invention principles addresses this deficiency and related problems.

SUMMARY OF THE INVENTION

A system according to invention principles uses separate RF pulses to excite individual slabs. In one embodiment, both RF pulses are asymmetric, one using a standard asymmetry such that the center of k-space is traversed late in the RF profile (called asymmetric RF from here on) and the second where the center of k-space is traversed early in the RF profile (referred to as reversed asymmetric RF from here on). These two RF pulses, asymmetric and reversed asymmetric, are concatenated for excitation in dual band MR imaging to provide a dual-slab acquisition of breast MR or peripheral MR angiography images, for example. When the two RF pulses are concatenated such that the asymmetric RF pulse is applied first and followed by the reversed asymmetric (described later in connection with an RF pulse of FIG. 3a), the difference in the TE between the two slabs is significantly reduced. The difference in TE may be further reduced if the polarity of the slice-select gradient of the second RF pulse is reversed as compared to the slice-select gradient of the first RF pulse (described later in connection with FIG. 3b). If the reversed asymmetric RF pulse is followed by the asymmetric RF pulse, then the TE difference will me maximized.

A system uses multiple RF coils in MR imaging of an anatomical volume of breast or other anatomy. An RF (Radio Frequency) signal generator generates RF excitation pulses in anatomical regions of interest and enables subsequent acquisition of associated RF echo data. A magnetic field gradient generator generates anatomical volume select magnetic field gradients for phase encoding and readout RF data acquisition. The RF signal generator and the gradient generator substantially concurrently acquire first and second volumes of first and second different anatomical regions by providing, a first RF pulse having a first asymmetric shape followed by a successive second RF pulse substantially having the first asymmetric shape but reversed in time, to substantially reduce echo time (TE) differences between acquisition of the first and second volumes and a phase encoding magnetic field gradient prepares for acquisition of data representing the first and second volumes.

DETAILED DESCRIPTION OF THE INVENTION

Figure 2:
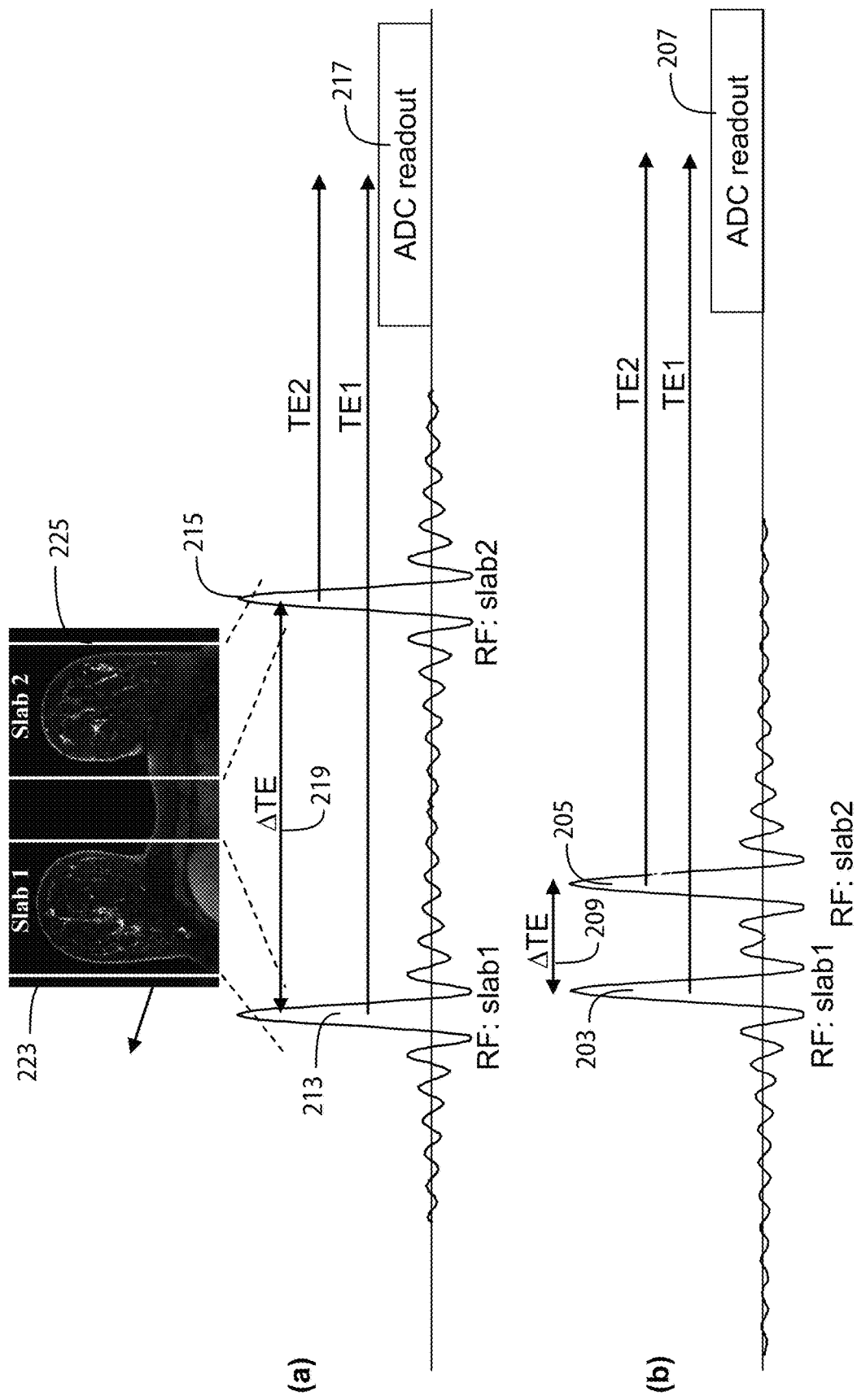
FIG. 2 shows difference in TE between the two slabs as a result of using (a) a known two symmetric RF pulse sequence and (b) a pulse sequence comprising one asymmetric pulse concatenated with a reversed asymmetric pulse, according to an embodiment of the invention.

A system in one embodiment, uses two concatenated separate RF pulses for wideband MRI advantageously reducing difference in echo time (TE) and image luminance contrast in dual slab imaging of left and right breasts, for example. FIG. 2(b) shows two concatenated separate RF pulses 203, 205 with corresponding echo time (TE1 and TE2) having reduced difference ΔTE 209 and used for acquisition of two slabs (e.g. of left and right breasts). The sequence of RF pulses 203, 205 advantageously comprises an asymmetric pulse 203 concatenated with a reversed asymmetric pulse 205 having respective echo times TE1, TE2 between the start of RF pulses 203, 205 to a maximum in the received echo signal during readout 207. In contrast, FIG. 2(*a*) shows a known two symmetric RF pulse sequence including RF pulses 213, 215 with corresponding echo time (TE1 and TE2) between the start of RF pulses 213, 215 to a maximum in the received echo signal during readout 217 and having difference ΔTE 219 substantially greater than ΔTE 209. The substantial difference in echo time ΔTE 219 results in difference in image luminance contrast in dual slab images 223, 225 of left and right breasts, impairing the diagnostic value of the images.

The system uses an asymmetric RF pulse 203 (center of the RF pulse is towards the end of the pulse, offering short TE with long repetition time TR) to acquire a first slab, followed by a reversed asymmetric RF pulse 205 (center of the RF pulse is towards the start of the pulse, one that offers long TE at short TR) to acquire a second slab. If a large asymmetry is used, the difference in TE between the two slabs may be minimized and made short. The time for a refocusing slice-select gradient pulse is also minimized by using the advantageous configuration of asymmetric pulses.

Figure 1:
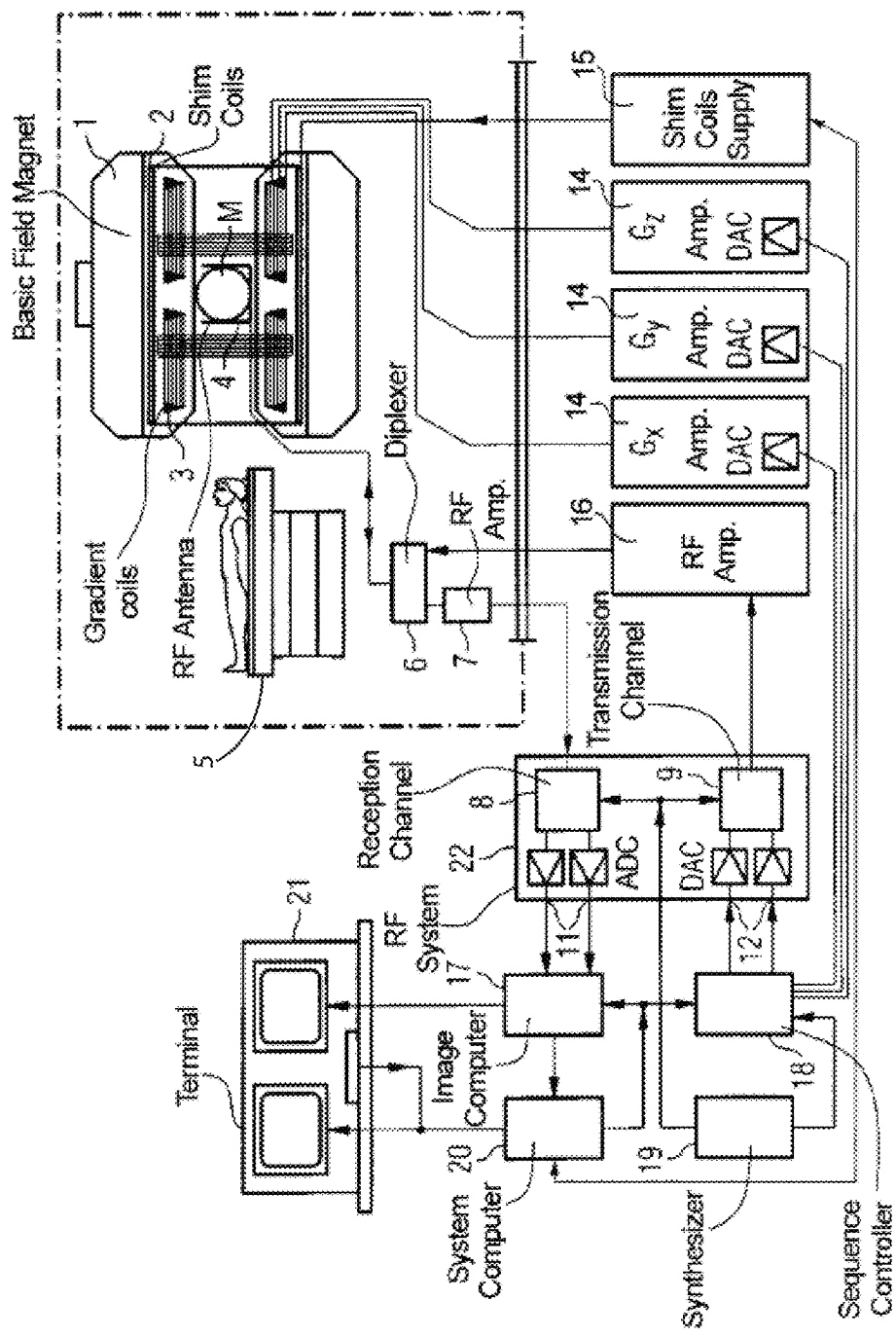
FIG. 1 shows system 10 for using multiple RF coils in MR imaging of an anatomical volume of breast or other anatomy, according to an embodiment of the invention.

FIG. 1 shows system 10 for using multiple RF coils in MR imaging of an anatomical volume of breast or other anatomy. In the basic field magnet 1, a cylinder-shaped gradient coil system comprising magnetic field gradient generator 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times. Homogeneity of the base magnetic field B0 is corrected using shim coils 2 electrically powered by shim coil supply 15.

Radio-frequency (RF) coils, comprising RF (Radio Frequency) signal generator 4, convert the radio-frequency pulses emitted by a radio-frequency power amplifier 16 via multiplexer 6 into a magnetic alternating field in order to excite the nuclei and align the nuclear spins of the object to be examined or the region of the object to be examined. RF (Radio Frequency) signal generator 4 generates RF excitation pulses in anatomical regions of interest and enables subsequent acquisition of associated RF echo data. The magnetic field gradient generator 3 generates anatomical slice specific magnetic field gradients for phase encoding and readout RF data acquisition. RF signal generator 4 and gradient generator 3 substantially concurrently acquire first and second image volumes of first and second different anatomical regions. For this purpose, units 3 and 4 provide, a first RF pulse having a first asymmetric shape followed by a successive second RF pulse substantially having the first asymmetric shape but reversed in time, to substantially reduce echo time (TE) differences between acquisition of the first and second volumes and a phase encoding magnetic field gradient for preparation for acquiring data representing the first and second volumes.

Figure 3:
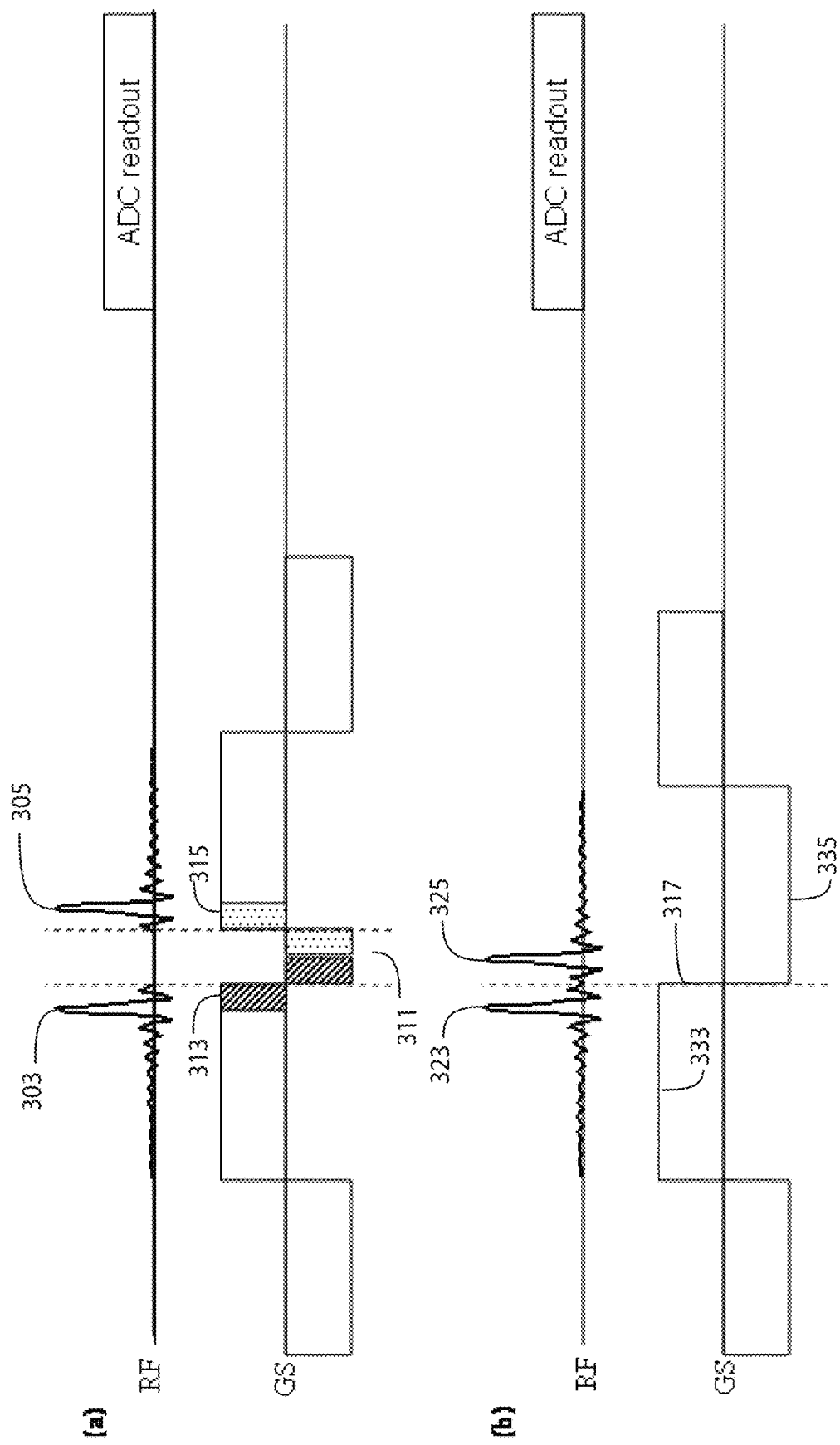
FIG. 3(a) shows a pulse sequence comprising concatenated asymmetric RF pulses with slice-select gradients of same polarity and FIG. 3(b) shows a pulse sequence comprising concatenated asymmetric RF pulses with slice-select gradients of opposite polarity, according to an embodiment of the invention.

FIG. 3(*a*) shows a pulse sequence comprising concatenated asymmetric RF pulses 303, 305 with slice-select gradients 313, 315 of same polarity and FIG. 3(*b*) shows a pulse sequence comprising concatenated asymmetric RF pulses 323, 325 with slice-select gradients 333, 335 of opposite polarity. Large asymmetry in concatenated RF pulses advantageously reduces difference in TE of acquisition of two slabs. The needed time duration of a refocusing slice-select gradient pulse is also reduced by advantageous use of large asymmetry in concatenated RF pulses. The slice-select refocusing gradient 311 in between the two RF pulses 303, 305 may be completely eliminated by reversing the polarity of the slice-select gradient on either one of the RF pulses as shown by gradient pulses 333 and 335. This slice-select gradient (GS also termed Gz) reversal method may also be used for symmetric pulses to minimize TE difference in acquisition of the two slabs, but the difference in TE is still relatively large unless short symmetric RF pulses with poor slice profile are used.

In a homogenous magnetic field and linear gradient field, such a reversal of slice-select gradient polarity is benign but beneficial in reducing the difference in TE in acquisition of the two slabs. However, reversal of the slice-select gradient polarity has an effect on an off-resonance tissue or fluid species, in that excitation of the off-resonance species is spatially shifted in the opposite direction. In applications where such a changing spatial shift occurring between acquisition of the two slabs may be a concern, it is better to use slice-select gradients of the same polarity. Further, in one embodiment, system 10 advantageously acquires images using two separated RF pulses 303, 305 for exciting two slabs to facilitate modification of the RF pulse phases to alter aliasing and improve image reconstruction efficiency. Also, the system is not limited to breast imaging, and may be used for other three dimensional (3D) or two dimensional (2D) MR imaging applications such as peripheral MR angiography, viewing contrast enhancement with subtraction methods, TSE (turbo spin-echo) applications such as in neuroimaging, diffusion MRI, (Blood Oxygenation Level Dependent) imaging, targeted coronary imaging and vessel wall imaging, for example.

In one embodiment, a VIBE (volumetric interpolated breath hold examination) sequence is used for imaging. A spectrally selective fat saturation pulse is applied once for each 40 RF excitations to suppress the signal from fat. Two asymmetric RF pulses (asymmetric and reversed asymmetric) are applied to excite two different sagittal imaging slabs. Following the excitation, phase encoding is performed and data is read out in a similar manner to standard single-slab VIBE imaging. Image reconstruction is performed by using a known method as described, for example, by Larkman and Moeller (Larkman et al., 2001 Larkman D J, Hajnal J V, Herlihy A H, Coutts G A, Young I R, Ehnholm G. "Use of multicoil arrays for separation of signal from multiple slices concurrently excited"; Moeller et al. 2009-Moeller S, Yacoub E, Olman C A, Auerbach E, Strupp J, Harel N, Ugurbil K., "Multiband multislice GE-EPI at 7 Tesla, with 16-fold acceleration using partial parallel imaging with application to high spatial and temporal whole-brain fMRI"). If the time between the centers of the two RF pulses (corresponding to center of k-space (k=0)), approaches half the duration of a symmetrically shaped pulse having a comparable slice profile, the advantages of using two concatenated asymmetric and reversed asymmetric pulses is substantially reduced.

In exemplary operation, the FIG. 3(*a*) pulse sequence is implemented on a Siemens MAGNETOM Verio MRI scanner. A 16-ch Sentinelle (Hologic) RF coil is used for imaging. Two cylindrical phantoms are placed, one horizontally in one breast coil and one vertically in the right breast coil. The imaging parameters used comprise, TR/TE=4.8/1.9, flip angle=12 degrees, resolution=1×1×1.6 mm$^3$, readout bandwidth=540 Hz/pixel, slab thickness=192 mm and separation between the two slabs=100 mm. The imaging results of the phantom scan are shown in FIG. 4.

Figure 4:
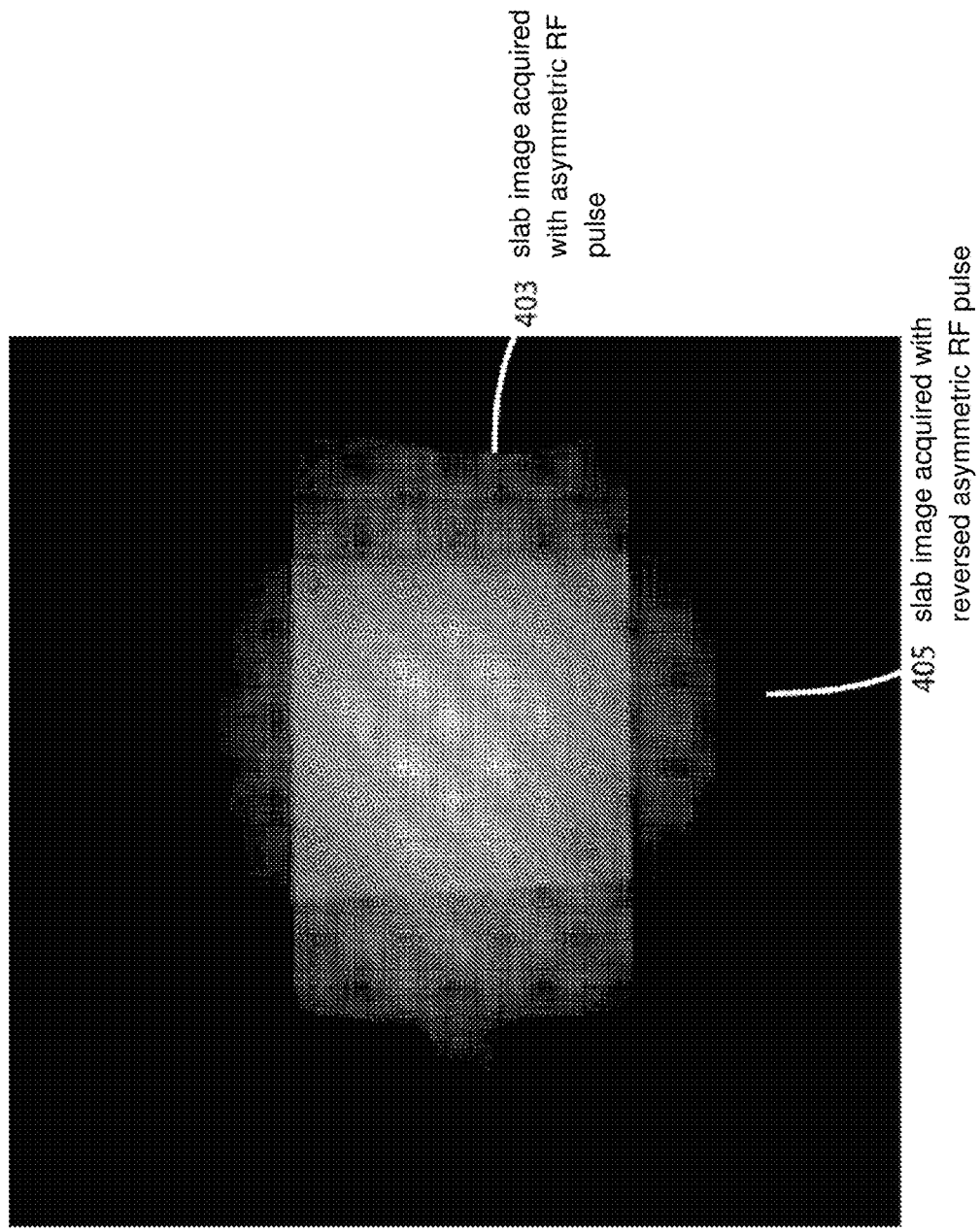
FIG. 4 shows an MR image comprising a simultaneous dual-slab acquisition using asymmetric and reversed asymmetric RF pulses to excite the two different slabs, according to an embodiment of the invention.

FIG. 4 shows an MR image showing concurrently acquired dual-slabs 403, 405 using asymmetric and reversed asymmetric RF pulses to excite the two different slabs. Due to dual slab excitation and concurrent readout, the images from both the phantoms are overlapped, one on top of the other. The acquired MR signal data is split into separate slabs based on the spatial information from the coil sensitivities, resulting in two different datasets, one for each sagittal slab. The images from the different slabs are not separated here so the two slabs, one with a horizontal phantom and one with a vertical phantom, are both overlapped.

The system advantageously uses an asymmetric RF pulse and a reversed asymmetric RF pulse to acquire two simultaneous imaging slabs with minimal difference in TE between the slabs using a VIBE sequence, for example. Alternatively, a variety of different sequences may be used. Two slabs of MR data are acquired substantially concurrently and are reconstructed into separate datasets based on different spatial locations. The RF coils see the signals originating from two different spatial locations and thus the signals having different properties. These properties are used to mathematically extract the left and right data separately. The RF pulse is asymmetric in shape, with the center of the pulse (the time point at which the amplitude is highest for a sinc pulse as shown in FIG. 2a, 2b, for example, being not in the center of the pulse, but offset to one side). The pulse sequence may be used with fat suppression preparation sequences. The system advantageously uses two concatenated asymmetric and reversed asymmetric RF pulses for concurrent dual slab imaging to minimize TE differences between successively excited slabs.

Figure 5:
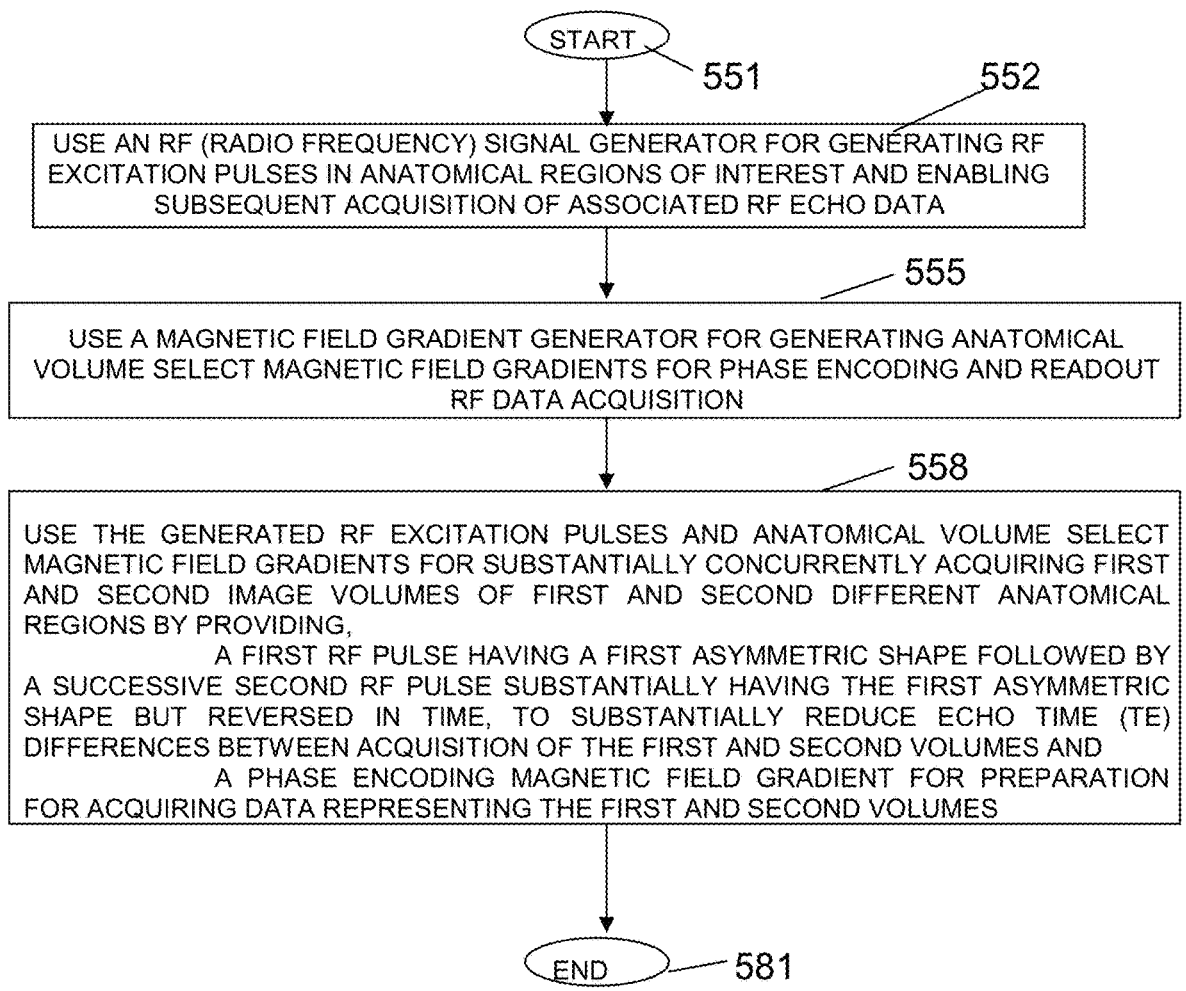
FIG. 5 shows a flowchart of a process performed by a system for using multiple RF coils in MR imaging of an anatomical volume of breast or other anatomy, according to an embodiment of the invention.

FIG. 5 shows a flowchart of a process performed by system 10 (FIG. 1) for using multiple RF coils in MR imaging of an anatomical volume of breast or other anatomy. In step 552, following the start at step 551, RF (Radio Frequency) signal generator 4 is used for generating RF excitation pulses in anatomical regions of interest and enabling subsequent acquisition of associated RF echo data. In step 555, gradient field system 3 is used for generating anatomical volume select magnetic field gradients for phase encoding and readout RF data acquisition. In step 558, signal generator 4 and gradient field system 3 generate RF excitation pulses and anatomical volume select magnetic field gradients for substantially concurrently acquiring first and second image volumes of first and second different anatomical regions.

A volume comprises a slice, for example. Specifically, units 3 and 4 provide, a first RF pulse having a first asymmetric shape followed by a successive second RF pulse substantially having the first asymmetric shape but reversed in time, to substantially reduce echo time (TE) differences between acquisition of the first and second volumes and a phase encoding magnetic field gradient for preparation for acquiring data representing the first and second volumes. The time between the first and second successive RF pulses is substantially minimized to minimize echo time (TE) differences between acquisition of the first and second volumes. In one embodiment, gradient field system 3 generates a gradient pulse in between the first and second RF pulses to rephase the slice select gradient for the first RF pulse and rephase the slice select gradient for the second RF pulse. In another embodiment, gradient field system 3 reverses a slice select gradient for the second successive RF pulse relative to the gradient for the first RF pulse. The process of FIG. 5 terminates at step 581.

Returning to FIG. 1, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Definitions.

EPI comprises Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

$TR_{ALL}$ comprises a total repetition time comprising multiple individual TR repetition times between successive RF excitation pulses for acquiring a predetermined total number of slices in a diffusion imaging direction using a particular diffusion encoding method.

TE (Echo Time) comprises a time period between the start of an RF pulse and the maximum in the received echo signal. The sequence is repeated every TR seconds.

B0 is the main static base MRI magnetic field.

B1 is the RF transmit coil field.

The system and processes of FIGS. 1-5 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses two concatenated separate RF pulses comprising an asymmetric pulse and a successive reversed asymmetric pulse for wideband MRI advantageously reducing difference in echo time (TE) and image luminance contrast in dual slab imaging of left and right breasts, for example. Further, the processes and applications may, in alternative embodiments, be located on one or more (e.g., distributed) processing devices on a network linking the units of FIG. 1. Any of the functions and steps provided in FIGS. 1-5 may be implemented in hardware, software or a combination of both.

What is claimed is:

1. A magnetic resonance (MR) system configured for using a plurality of RF coils in MR imaging of an anatomical volume of breast or other anatomy, comprising:

an RF (Radio Frequency) signal generator configured for generating RF excitation pulses in anatomical regions of interest within the anatomical volume of breast or other anatomy, and enabling subsequent acquisition of associated RF echo data; and a magnetic field gradient generator configured for generating anatomical volume selecting magnetic field gradients for performing phase encoding and readout RF data acquisition on the anatomical volume of breast or other anatomy, said RF signal generator and said gradient generator substantially concurrently acquiring first and second image volumes of first and second different anatomical regions of interest by providing, a first RF pulse with the RF signal generator, having a first asymmetric shape concatenated with a successive second RF pulse substantially having said first asymmetric shape but reversed in time, in order to substantially reduce echo time (TE) differences between acquisition of said first and second image volumes of the first and second different anatomical regions of interest, and a phase encoding magnetic field gradient that prepares the next acquisition of data representing said first and second image volumes of the first and second different anatomical regions of interest.

2. A system according to claim 1, wherein each of the first and second image volumes comprises a slice.

3. A system according to claim 2, wherein said gradient generator generates a gradient pulse in between the first and second RF pulses to rephase the slice select gradient for the first RF pulse and rephase the slice select gradient for the second RF pulse.

4. A system according to claim 2, wherein said gradient generator reverses a slice select gradient for the second successive RF pulse relative to the gradient for the first RF pulse.

5. A system according to claim 1, wherein the time between the first and second successive RF pulses is substantially minimized to minimize echo time (TE) differences between acquisition of said first and second volumes.

6. A magnetic resonance (MR) method configured for using a plurality of RF coils in MR imaging of an anatomical volume of breast or other anatomy, comprising the activities of:

using an RF (Radio Frequency) signal generator configured for generating RF excitation pulses in anatomical regions of interest within the anatomical volume of breast or other anatomy, and enabling subsequent acquisition of associated RF echo data; and using a magnetic field gradient generator configured for generating anatomical volume selecting magnetic field gradients for performing phase encoding and readout RF data acquisition on the anatomical volume of breast or other anatomy;

using the generated RF excitation pulses and anatomical volume select magnetic field gradients for substantially concurrently acquiring first and second image volumes of first and second different anatomical regions of interest by providing, a first RF pulse with the RF signal generator, having a first asymmetric shape concatenated with a successive second RF pulse substantially having said first asymmetric shape but reversed in time, to substantially reduce echo time (TE) differences between acquisition of said first and second image volumes of the first and second different anatomical regions of interest, and a phase encoding magnetic field gradient that prepares the next acquisition of data representing said first and second image volumes of the first and second different anatomical regions of interest.

7. A method according to claim 6, wherein each of the first and second image volumes comprises a slice.

8. A method according to claim 7, including the activity of generating a gradient pulse in between the first and second RF pulses to rephase the slice select gradient for the first RF pulse and rephase the slice select gradient for the second RF pulse.

9. A method according to claim 7, including the activity of reversing a slice select gradient for the second successive RF pulse relative to the gradient for the first RF pulse.

10. A method according to claim 6, wherein the time between the first and second successive RF pulses is substantially minimized to minimize echo time (TE) differences between acquisition of said first and second volumes.

11. Programmed computer instructions stored on a non-transitory storage medium comprising:

a magnetic resonance (MR) method configured for using a plurality of RF coils in MR imaging of an anatomical volume of breast or other anatomy, comprising the activities of:

using an RF (Radio Frequency) signal generator configured for generating RF excitation pulses in anatomical regions of interest within the anatomical volume of breast or other anatomy, and enabling subsequent acquisition of associated RF echo data; and using a magnetic field gradient generator configured for generating anatomical volume selecting magnetic field gradients for performing phase encoding and readout RF data acquisition on the anatomical volume of breast or other anatomy;

using the generated RF excitation pulses and anatomical volume select magnetic field gradients for substantially concurrently acquiring first and second image volumes of first and second different anatomical regions of interest by providing, a first RF pulse with the RF signal generator having a first asymmetric shape concatenated with a successive second RF pulse substantially having said first asymmetric shape but reversed in time, to substantially reduce echo time (TE) differences between acquisition of said first and second image volumes of the first and second different anatomical regions of interest, and a phase encoding magnetic field gradient that prepares the next acquisition of data representing said first and second image volumes of the first and second different anatomical regions of interest.

12. Programmed computer instructions according to claim 11, wherein each of the first and second image volumes comprises a slice.

13. Programmed computer instructions according to claim 12, including the activity of generating a gradient pulse in between the first and second RF pulses to rephase the slice select gradient for the first RF pulse and rephase the slice select gradient for the second RF pulse.

14. Programmed computer instructions according to claim 12, including the activity of reversing a slice select gradient for the second successive RF pulse relative to the gradient for the first RF pulse.

15. Programmed computer instructions according to claim 11, wherein the time between the first and second successive RF pulses is substantially minimized to minimize echo time (TE) differences between acquisition of said first and second volumes.

* * * * *